US012768913B2

(12) United States Patent
Jantzi et al.

(10) Patent No.: US 12,768,913 B2
(45) Date of Patent: Oct. 20, 2026

(54) REUSABLE MAGNETIC SENSOR CIRCUIT AND METHODS THEREFOR

(71) Applicant: BlackBerry Limited, Waterloo (CA)

(72) Inventors: Jason Wayne Jantzi, St. Clements (CA); Yu Gao, Waterloo (CA); Mahendra Fuleshwar Prasad, Waterloo (CA)

(73) Assignee: BlackBerry Limited, Waterloo (CA)

( * ) Notice: Subject to any disclaimer, the term of this patent is extended or adjusted under 35 U.S.C. 154(b) by 165 days.

(21) Appl. No.: 18/540,961

(22) Filed: Dec. 15, 2023

(65) Prior Publication Data

US 2025/0199091 A1 Jun. 19, 2025

(51) Int. Cl.
*G01R 33/06* (2006.01)

(52) U.S. Cl.
CPC .................................... *G01R 33/06* (2013.01)

(58) Field of Classification Search
None
See application file for complete search history.

(56) References Cited

U.S. PATENT DOCUMENTS 8,079,925 B2 * 12/2011 Englert .................. A63B 43/00 473/569
8,602,431 B1 * 12/2013 May .......................... B60R 3/02 280/166
2005/0024207 A1 * 2/2005 Schebel ................. G08B 13/08 340/539.1
2013/0221759 A1 * 8/2013 Schlachter ............. G01R 33/07 324/207.2
2016/0346671 A1 * 12/2016 Jarchafjian ......... A63F 3/00694
2017/0075405 A1 3/2017 Jensen et al.
(Continued)

FOREIGN PATENT DOCUMENTS

CN 114019233 A 2/2022
CN 217919499 U 11/2022
JP 2012173260 A 9/2012
(Continued)

OTHER PUBLICATIONS

European Extended Search Report; Application No. 24217437.3; Jun. 30, 2025; 11 pages.

*Primary Examiner* — Nasima Monsur
(74) *Attorney, Agent, or Firm* — Conley Rose, P.C.; J. Robert Brown, Jr.

(57) ABSTRACT

A system comprising a magnetic sensor circuit for detecting a magnetic field, a magnet in close proximity to the magnetic sensor circuit, a wireless transceiver, and a controller. The controller coupled to the magnetic sensor circuit and to the wireless transceiver, and having a sleep operating mode and an awake operating mode, storing executable instructions which, when executed, cause the controller to receive a first signal from the magnetic sensor circuit indicating a lack of presence of the magnetic field. In response to the first signal, send a second signal, via the wireless transceiver, to a remote server indicating the reusable system is awake, and switch from the sleep operating mode of the controller to the awake operating mode, wherein the awake operating mode of the controller listens for a third signal from the magnetic sensor circuit. In response to the third signal, the controller performs a function.

20 Claims, 5 Drawing Sheets

(56) References Cited

U.S. PATENT DOCUMENTS

2019/0391213 A1* 12/2019 Alford ............... G01R 33/0094

FOREIGN PATENT DOCUMENTS

| | | | |
|---|---|---|---|
| JP | 6340374 | B2 | 6/2018 |
| JP | 7259633 | B2 | 4/2023 |
| KR | 20030089930 | A | 11/2003 |
| WO | 2021042942 | A1 | 3/2021 |

* cited by examiner

REUSABLE MAGNETIC SENSOR CIRCUIT AND METHODS THEREFOR

FIELD

The present application relates to single-use magnetic sensor circuits.

BACKGROUND

Components found on electrical circuit boards fail from time to time. Some failures can lead to catastrophic events if the circuit boards are in close proximity to explosive or expensive cargo during transportation. The American National Standard Institute (ANSI) has outlined "intrinsically safe" design requirements. Intrinsically safe products are required to comply with the strict requirements to prevent spark or thermal ignition. For example, a device may be hermetically sealed to prevent the gas mixture and spark ignition meeting to potentially cause an explosion. In the past, installation of a radar device may have required opening the enclosure of a radar device, and then connecting the battery to the circuit. However, for intrinsically safe products, this may no longer be a viable option as intrinsically safe radar products may have their enclosures sealed.

To meet intrinsically safe requirements, a magnet may be distributed and coupled to the outside enclosure of the device. The removal of the magnet from the outside enclosure of the device causes the device to power up or start. Thereafter, typically, the magnetic sensor circuit within the device is not used again during the life of the device and the removed magnet is tossed in the trash.

BRIEF DESCRIPTION OF THE DRAWINGS

Reference will now be made, by way of example, to the accompanying drawings which show example embodiments of the present application. In the drawings.

Like reference numerals are used in the drawings to denote like elements and features.

DETAILED DESCRIPTION OF EXAMPLE EMBODIMENTS

Figure 1:
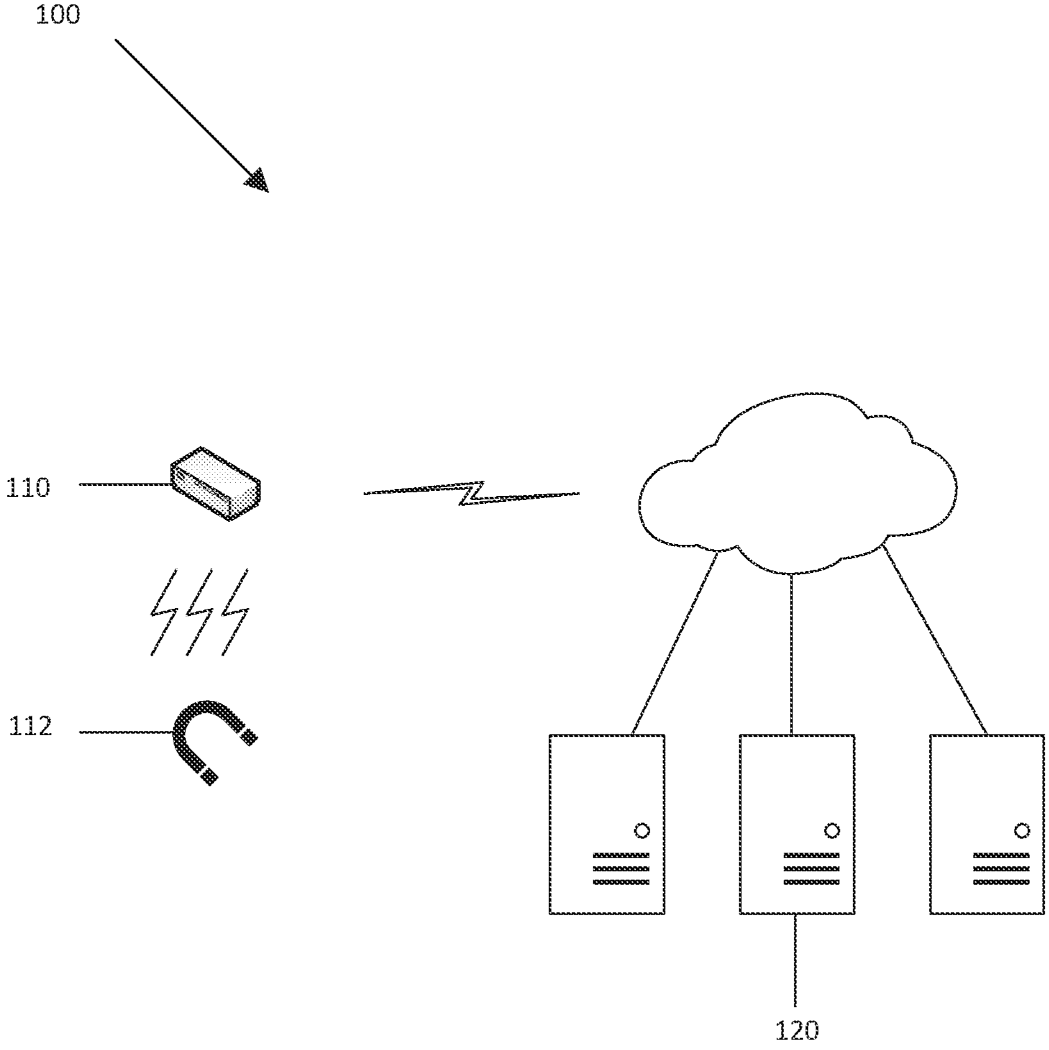
FIG. 1 is a simplified diagram of a reusable system whereby a magnet is removably coupled to a device in accordance with an example of the present application.

In one aspect, the present application describes a reusable system for magnetic sensing. The reusable system may include a magnetic sensor circuit. The magnetic sensor circuit may be used for detecting a magnetic field. The reusable system may further include a magnet. The magnet may be in close proximity to the magnetic sensor circuit. The reusable system may further include a communications module. The module may be used to communicate with a remote server. The reusable system may further include a controller. The controller may be coupled to the magnetic sensor circuit. The controller may be coupled to the communications module. The controller may have a sleep mode. The controller may be storing executable instructions which, when executed, cause the controller to perform the following functions. The controller may receive a signal from the magnetic sensor circuit indicating a lack of presence of the magnetic field. The controller may, in response to the signal, send a second signal, via the communications module, to the remote server indicating the reusable system is awake. The controller may switch from the sleep operating mode of the controller to an awake operating mode, wherein the awake operating mode of the controller listens for a further signal from the magnetic sensor circuit. The controller, in response to the further signal, may perform an additional function.

In some implementations, the further signal from the magnetic sensor circuit may indicate that the magnetic field is detected proximate the magnetic sensor circuit.

In some implementations, the additional signal may include causing transmission of a message to the remote system regarding detection of the magnetic field.

In some implementations, the reusable system may include at least one sensory output device. The additional function may include causing output of a sensory signal from the sensory output device.

In some implementations, the sensory output device may include one or more of an audio output device, a light output device, or a vibratory output device.

In some implementations, the instructions, when executed, may further cause the controller to perform the following steps. The controller may receive a third signal, via the communications module, from the remote server. The controller may switch the awake operating mode to a selected operating mode. In response to the third signal, the controller may perform a further additional function.

In some implementations, the instructions, when executed, may further cause the controller to perform the following steps. The controller may receive a new operating mode, via the communications module, from the remote server. In response to receiving the new operating mode, the controller may switch to the new operating mode and perform a further additional function.

In some implementations, the further signal from the magnetic sensor circuit may indicate that the magnetic field is detected with respect to a door magnet coupled to a sliding door. The additional function may include causing transmission of a message, via the communications module, to the remote server regarding a position of the sliding door.

In some implementations, the further signal from the magnetic sensor circuit may indicate that the magnetic field is detected with respect to a hopper switch. The additional function may include causing transmission of a message, via the communications module, to the remote server regarding data of the hopper switch.

In some implementations, the further signal from the magnetic sensor circuit may indicate that the magnetic field is detected with respect to a trailer connector. The additional function may include initiating pairing between the reusable system and an asset device.

In some implementations, the further signal from the magnetic sensor circuit may indicate an unknown magnetic field. The additional function may include causing transmission of a message, via the communications module, to the remote server regarding a threat.

In some implementations, the additional function may include causing transmission of a message, via the communications module, to the remote server requesting an update, and receive the update from the remote server. In response to receiving the update, the controller may perform a further additional function.

In some implementations, the additional function may include initiating pairing between the reusable system and an asset device.

In some implementations, the reusable system may include a plurality of magnetic field sensors. The magnetic field sensors may be coupled to the magnetic sensor circuit. The additional function may include the following steps. The controller may be receiving a plurality of magnetic fields from the plurality of magnetic field sensors. The controller may be determining an orientation of the reusable system based on the plurality of magnetic fields. In response to the determination of the orientation, the controller may be sending an additional signal, via the communications module, to the remote server, indicating the orientation of the reusable system.

In another aspect of the invention, the present invention describes a computer-implemented method for switching operating modes of a controller based on a signal from a magnetic sensor circuit. The method may include receiving the signal from the magnetic sensor circuit indicating a lack of presence of a magnetic field. The method, in response to the signal, may send a second signal, via the communications module, to a remote server indicating the reusable system is awake, and switching from a sleep operating mode of the controller to an awake operating mode. The method wherein the awake operating mode of the controller may listen for a further signal from the magnetic sensor circuit. In response to the further signal, the controller may perform an additional function.

In some implementations, the further signal from the magnetic sensor circuit may indicate the magnetic field is detected proximate the magnetic sensor circuit.

In some implementations, the additional function may include causing transmission of a message to the remote system regarding detection of the magnetic field.

In some implementations, the reusable system may include at least one sensory output device and wherein the additional function includes causing output of a sensory signal from the sensory output device.

In some implementations, the sensory output devices may include one or more of an audio output device, a light output device, or a vibratory output device.

In some implementations, the further signal from the magnetic sensor circuit may indicate that the magnetic field is detected with respect to a door magnet coupled to a sliding door. The additional function may include causing transmission of a message, via the communications module, to the remote server regarding a position of the sliding door.

Other aspects and features of the present application will be understood by those of ordinary skill in the art from a review of the following description of examples in conjunction with the accompanying figures.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

The present disclosure relates to a device, such as radar device, having a reusable magnetic sensor circuit that satisfies intrinsically safe requirements. Intrinsically safe apparatuses typically refer to electrical equipment in which the circuits are intrinsically safe circuits whilst in a hazardous area. For example, an intrinsically safe circuit may be characterized in that any spark or thermal effect produced under the conditions specified in IEC 60079-11, which include normal operations and specified fault conditions, is not capable of causing ignition of a given explosive atmosphere.

Intrinsically safe products may have strict requirements to prevent spark and thermal ignition. In some cases, this requires a hermetically sealed device which prevents gas mixture and spark ignition meeting to potentially cause an explosion. Some previous radar products required the battery to be installed by opening the device and then connecting the battery to the circuit. For intrinsically safe products, this may no longer be a viable option.

Accordingly, to overcome the above, a magnetic sensor circuit may be added to a device and a magnet may be placed outside of the housing enclosure of the device. To activate the device without opening the housing enclosure, the magnet is removed from the housing enclosure. The magnetic sensor circuit generates a signal based on detecting an absence of a magnetic field and the signal triggers the device to activate and power up. Thereafter, the magnetic sensor circuit and the removed magnet may be repurposed.

In some examples, radar devices may use a Hall effect, tunnel magnetoresistance (TMR), reed switch or equivalent magnetic sensor. The device may be deployed with a physical magnet installed or placed in close proximity to the magnetic sensor. Once the magnet is removed by the installer, the magnetic sensor circuit triggers the device to power up. Then, the device establishes a cellular data connection and connects to a remote server. Afterwards, the magnetic sensor circuit may perform one or more different types of use cases. The different use cases may include, for example, door detection, hopper switch detection, sliding door actuator detection, initiate pairing, etc. In other words, the magnet sensor circuit can be reused for an alternative use case or a multitude of use cases and not just for initially triggering the device to wake up and power on.

Reference will now be made to FIG. 1, which shows an illustrative diagrammatic example of a reusable system 100 having a device 110, a magnet 112 and a remote server 120. The device may be attached to shipping containers, train cars, or truck frames.

The device 110 may comply with intrinsically safe requirements. The intrinsically safe requirements may be outlined in the document IEC 60079-11 International Standard.

The device 110 may be coupled to a magnet 112. In other implementations, the device 110 may be coupled to one or more magnets. The device 110 may be coupled to objects that generate a magnetic field (not shown) in place of the magnet 112. For example, the device 110 may be coupled to a conductor that produces a magnetic field, electromagnets, and/or magnetic materials that have been magnetized. The magnet 112 may be one of the following types of magnets: neodymium magnet, ceramic (ferrite) magnets, alnico magnets, flexible magnets, and rubber coated magnets. The magnet 112 may have various sizes and shapes. The magnet 112 may be unipolar, omni-polar, or flip based on the different types of use cases. The device 110 may detect various properties or characteristics of the magnetic field generated by the magnet 112, such as the strength and direction.

The magnet 112 may be in close proximity to the device 110. For example, close proximity may mean the magnet 112 is adjacent to the device 110. The magnet 112 may be attached or connected to the housing enclosure of the device 110. The magnet 112 may be removable from the housing enclosure of the device 110. The magnet 112 may be between 1 mm to 5 cm from the device 110. The distance between the device 110 and the magnet 112 may vary depending on configurations of the device 110.

The device 110 may communicate to a remote server 120. The device 110 may communicate to a plurality of remote servers. The device 110 may send or receive messages to and from the remote server 120. The remote server 120 may send or receive messages to and from the device 110.

In some cases, the device 110 may be an asset tracking device. The device 110 may be a radar asset tracking device. The device 110 may be used for trailer tracking, chassis and flatbed tracking, intermodal container tracking, equipment tracking, and railcar tracking and monitoring.

The device 110 may be configured to establish a wireless connection with one or more mobile networks. The wireless connection may be a mobile wireless connection over 4G, 5G or other wireless connection technology. In some cases, the wireless connection may be over Wi-Fi. The reusable system 100 may exchange communications with one or more remote servers over the wireless connection.

Figure 2:
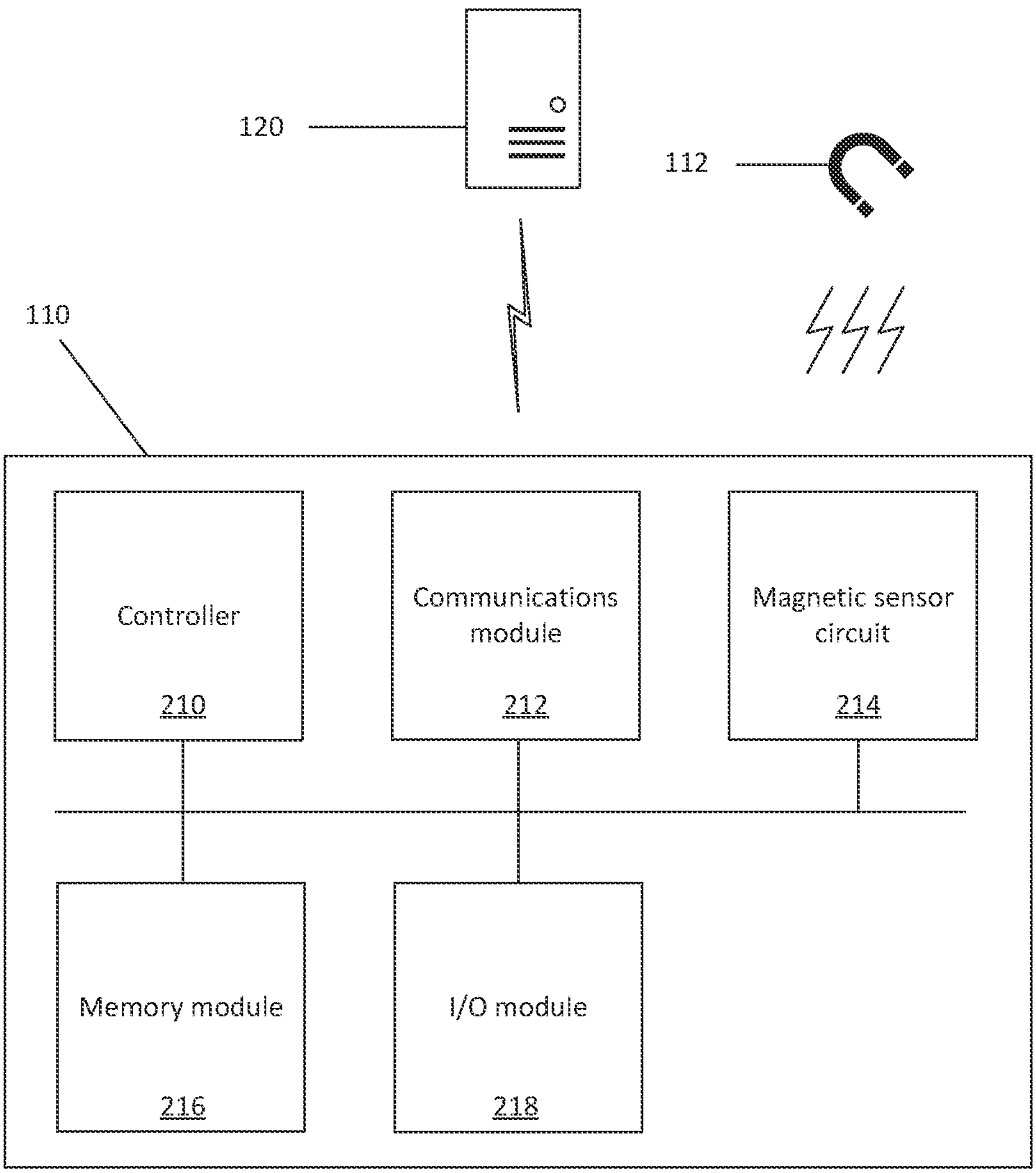
FIG. 2 is a simplified block diagram of the components of the device in FIG. 1.

Reference is now made to FIG. 2, which diagrammatically shows a simplified example of the device 110 from FIG. 1. The device 110 may include the following components: a controller 210, a communications module 212, a magnetic sensor circuit 214, a memory module 216, and an input/output (I/O) module 218. In some implementations, the controller 210 may be coupled to the magnetic sensor circuit 214 and the communications modules 212. The controller 210 may further be coupled to the memory module 216 for storing executable instructions. The controller 210 may store the executable instructions within itself. The controller 210, in some embodiments, may be a microprocessor. In some cases, the controller 210 may be a microcontroller, an application-specific integrated circuit (ASIC), or another processing unit.

The controller 210 may have various modes, for example, a sleep operating mode, an awake operating mode, and a pairing mode for performing various activities. The controller 210 may be initially programmed to be in the sleep operating mode. In sleep operating mode, the controller 210 may be continuously or intermittently listening for a signal from the magnetic sensor circuit 214. The signal from the magnetic sensor circuit 214 may indicate that the magnetic field from the magnet 112 is no longer detectable or there may be a change in the strength or position of the magnetic field. In sleep mode, the controller may have powered down or disabled other components coupled to the controller 210, for example, an actuator, various sensors, the I/O module 218 or the communications module 212 to conserve battery power or energy.

The controller 210 may switch from the sleep operating mode to an awake operating mode. In the awake operating mode, the controller 210 may activate one or more components connected thereto. In the awake operating mode, the controller 210 may send a message to the remote server 120 indicating that the device 110 is awake. In the awake operating mode, the controller may send data regarding the device 110 to the remote server 120. In awake operating mode, the controller 210 may also be continuously listening for a further signal from the magnetic sensor circuit 214 similar to the sleep operating mode.

The controller 210, in the awake operating mode, after receiving a further signal from the magnetic sensor circuit 214, may perform an additional function. The additional function may include one or more of asset door detection, hopper switch detection, trailer connector detection, etc. The additional function will be discussed in further detail below.

The communications module 212 may be coupled to the controller 210. The communications module 212 may communicate with the remote server 120. The communication module 212 may include a cellular transceiver configured to connect to one or more wireless network, such as a wide area network (WAN). The communications module 212 may be configured to establish a wireless communication channel over one or more data networks, including one or more cellular data networks, the Internet, and/or other data networks, to connect to the remote server 120.

The magnetic sensor circuit 214 may detect a magnetic field. The magnetic sensor circuit 214 may include a magnetic sensor, such as a Hall effect sensor, fluxgate magnetometer, and magneto-resistive sensors to detect the magnetic field. The magnetic sensor circuit 214 may include one or more magnetic sensors. The one or more magnetic sensors may generate one or more signals based on the one or more magnetic fields.

The controller 210 may be coupled to the memory module 216. The memory module 216 may store executable instructions which, when executed, may cause the controller to perform a plurality of method steps.

The controller 210 may be coupled to the input/output (I/O) module 218. The I/O module 218 may include an audio output device, a light output device or a vibratory output device. The I/O module 218 may output a notification regarding the status of the device 110, such as whether the device is activated or deactivated, for example, using sound and/or light. The I/O module 218 may include one or more LEDs, which may be visible from the device. The I/O module 218 may alternatively or additionally include a speaker or other audio output device. The controller 210 may be configured to cause output of a visual and/or auditory signal using the I/O module 218. For example, upon a change in the magnetic field, the LEDs on the I/O module 218 may illuminate a certain color.

The controller 210 may be coupled to various sensors (not shown). In various embodiments, the various sensors may include one or more of an ambient light sensor, an infrared (IR) proximity sensor, a capacitive proximity sensor, an inductive sensor, or a circuit-break sensor.

Figure 3B:
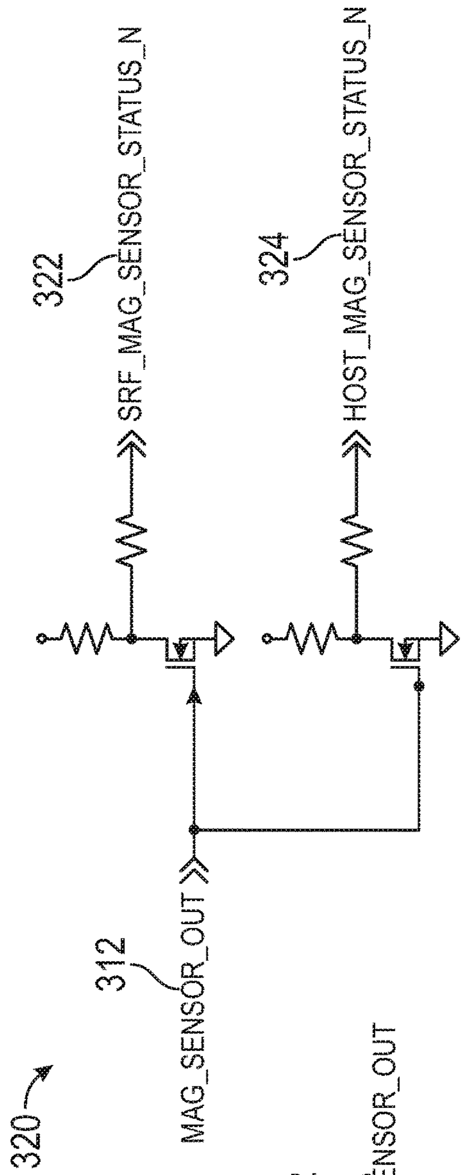
FIG. 3*b* is a simplified circuit diagram of an example amplification circuit that may be found in the device in FIG. 1.
Figure 3A:
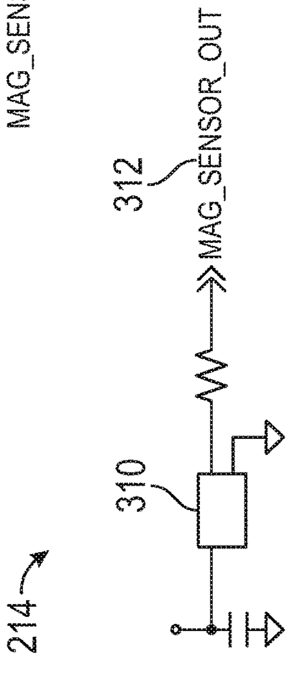
FIG. 3*a* is a simplified circuit diagram of the magnetic sensor circuit in FIG. 2.

Reference is now made to FIG. 3*a* which shows, in circuit diagram form, one simplified example of a magnetic sensor circuit 214 having a magnetic field sensor 310. The magnetic sensor circuit 214 may provide a magnetic sensor output 312 to the controller 210 (FIG. 2). The magnetic sensor output 312 may indicate the presence of a magnetic field by the magnetic field sensor 310. In some embodiments, the magnetic sensor output 312 may indicate the strength or the direction of the magnetic field.

Reference is now made to FIG. 3*b* which shows, in circuit diagram form, one simplified example of an amplification circuit 320. The amplification circuit 320 may receive the magnetic sensor output 312. The device 110 (FIG. 1) may include the amplification circuit 320. The amplification circuit may provide a first output 322 to a short-range frequency circuit (not shown) and/or a second output 324 to the controller 210 (FIG. 2).

Figure 3C:
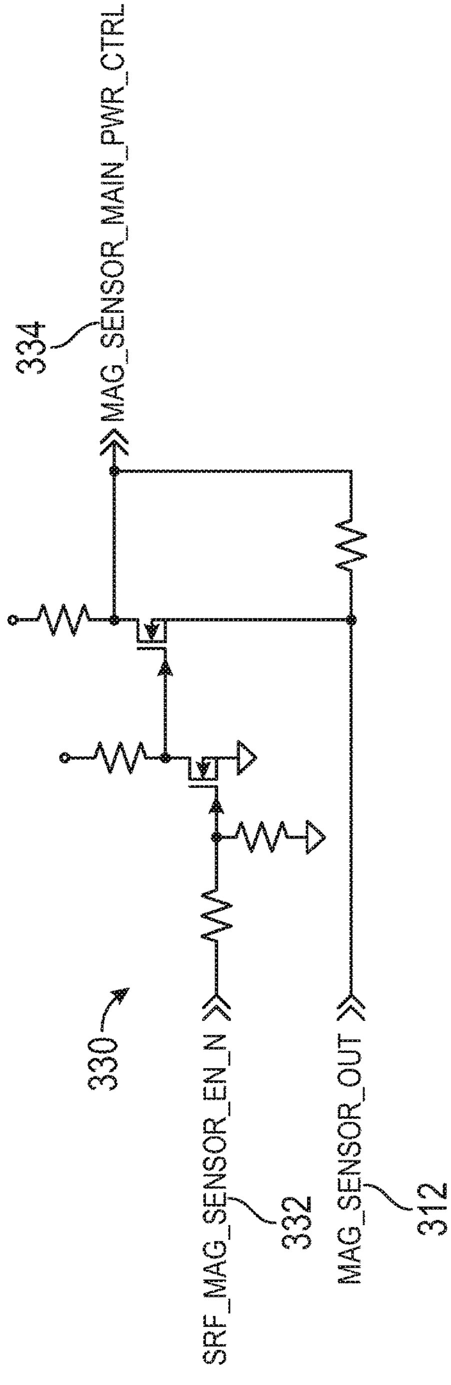
FIG. 3*c* is a simplified circuit diagram of an example control circuit that may be found in the device of FIG. 1.

Reference is now made to FIG. 3*c* which shows, in circuit diagram form, one simplified example of a control circuit 330. The control circuit 330 may receive a short-range frequency circuit output 332 and/or the magnetic sensor output 312. The device 110 (FIG. 1) may include the control circuit 330. The control circuit 330 may provide a magnetic sensor main power control output 334.

Figure 4:
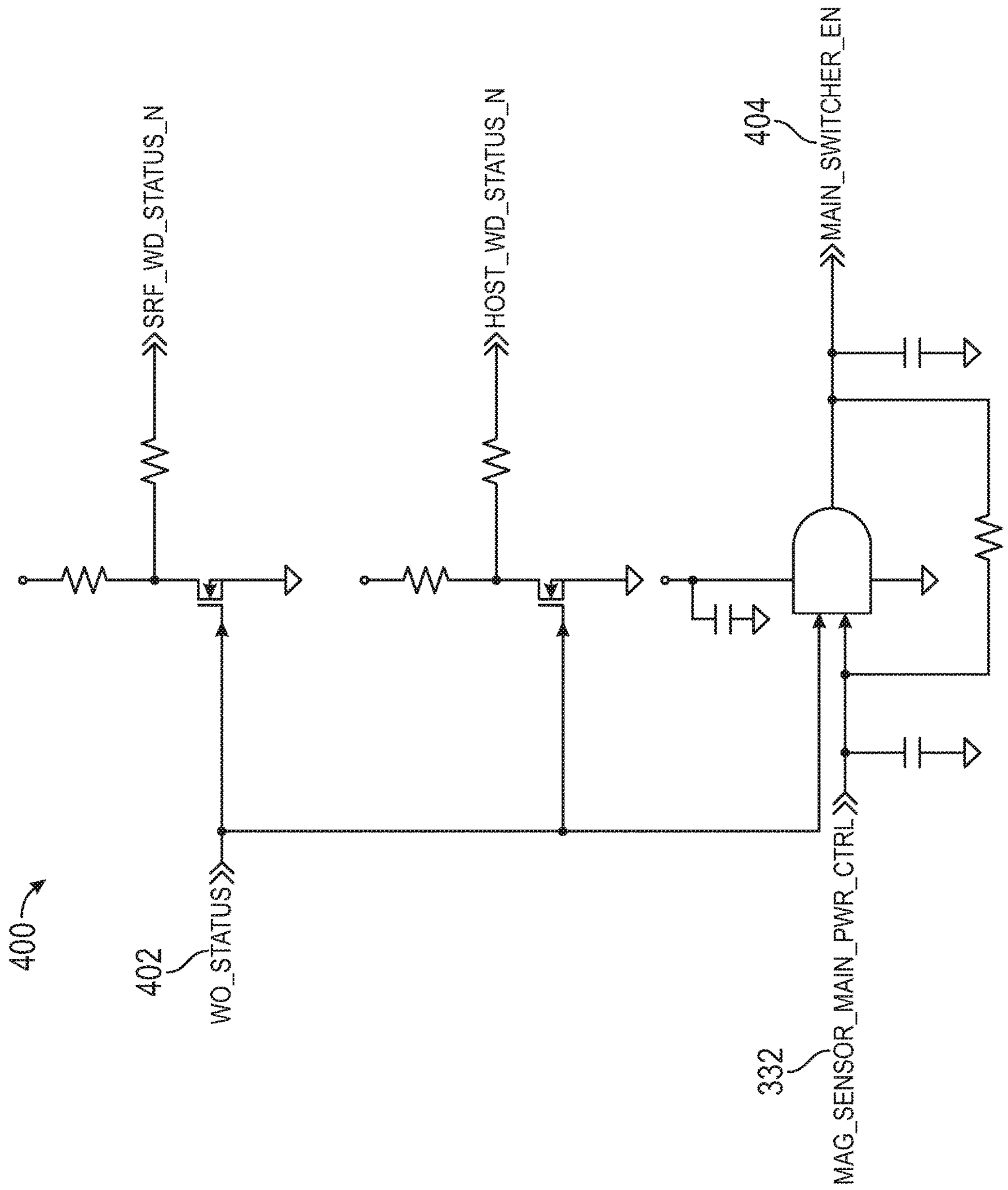
FIG. 4 is a simplified circuit diagram of an example watchdog circuit that may be found in the device of FIG. 1.

Reference is now made to FIG. 4 which shows, in circuit diagram form, one simplified of a watchdog circuit 400. The watchdog circuit 400 may receive a watchdog input 402 from, for example, a watchdog timer (not shown) and/or the short-range frequency circuit output 332. The device 110 (FIG. 1) may include the watchdog circuit 400. The watchdog circuit 400 may provide an output 404 to the main switcher (not shown) to power the device 110 (FIG. 1).

Figure 5:
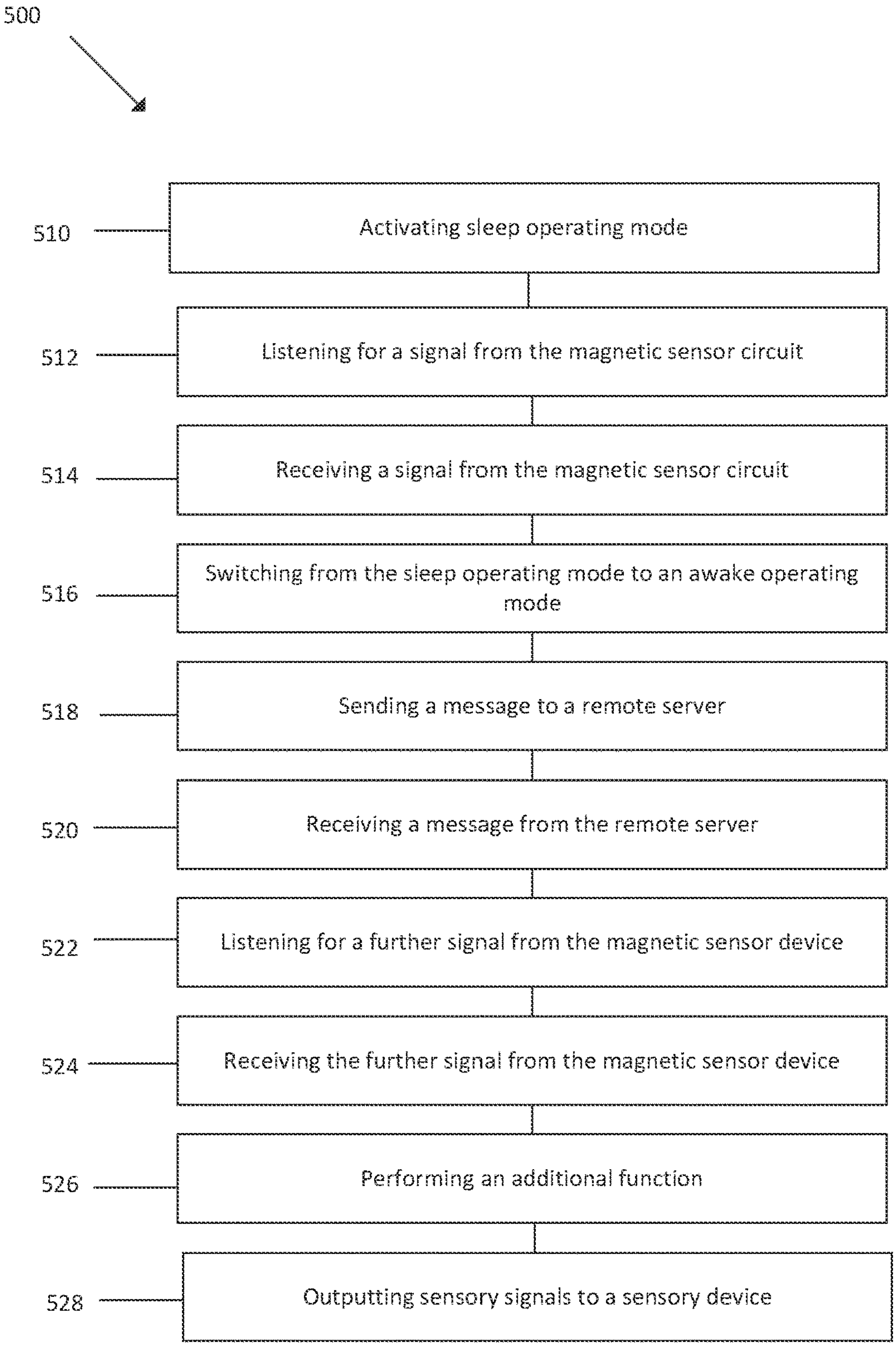
FIG. 5 shows an illustrative method to reuse the magnetic sensor circuit.

Reference is now made to FIG. 5 which provides an example method 500 of reusing the magnetic sensor circuit. In this example, the controller may be configured to transition between a sleep operating mode to an awake operating mode on the basis of a lack of presence of a magnetic field, a change in the presence of the magnetic field, or a weak magnetic field detected by the magnetic field sensor.

In operation 510, the controller may be deployed in a sleep operating mode, a power-saving mode, or a low-power mode. In some cases, in the sleep operating mode, the controller may have disabled other components coupled to the controller. The other components may include the communications module, the memory module, the I/O module, actuators, and sensors. In some cases, in sleep operating mode, the controller may prioritize preserving battery life or reducing power consumption. In some cases, the controller or the magnet sensor circuit may be calibrated to only detect the presence of the magnetic field emitted from the magnet. In some cases, in the sleep operating mode, the background activities of the controller may be turned off. The background activities may include interrupt handling, peripheral management, power management, background communication, memory management, error handling and security features.

In operation 512, the controller may be listening for a signal from the magnetic sensor circuit. While the controller is listening for a signal, the controller may remain in the sleep operating mode. In some cases, the controller may be continuously or intermittently listening for the signal from the magnetic sensor circuit.

In operation 514, the controller may be receive a signal from the magnetic sensor circuit. The signal may be generated by the magnetic sensor circuit due to a variation in the magnetic field, a presence of a magnetic field, and/or a lack of presence of a magnetic field. The magnetic field may be emitted by the magnet.

In operation 516, in response to receiving a signal from the magnetic sensor circuit, the controller may switch from the sleep operating mode to an awake operating mode. In the awake operating mode, the controller may activate other components, such as the communications module, and the I/O module. In some cases, the controller may retrieve the executable instructions of the sleep operating mode and the awake operating mode from the memory module. The signal from the magnetic sensor circuit may be generated by the removal of the magnet from the housing enclosure of the device. The magnet may be reused after operations 512 or 514. For example, the magnet may be saved and reused to cause additional signals to be generated by the magnetic sensor circuit.

In operation 518, in response to receiving a signal from the magnetic sensor circuit, the controller may send a message to the remote server using the communications module. The message may indicate that the controller or the device is awake, active, or operational. The controller may also provide data to the remote server. The data may include sensor data, such as temperature, pressure, proximity, motion, humidity, image, and magnetic data. The remote server may log that event, may transmit the information to an administrator, and/or may generate and send a notification to one or more accounts associated with the device.

In operation 520, the controller, via the communications module, may receive a message from the remote server. The message may include an update for the controller. The message may provide instructions for the controller.

In operation 522, in the awake operating mode, the controller may be listening for a further signal from the magnetic sensor circuit. The further signal from the magnetic sensor circuit may be generated from a further change in the magnetic field. The further change in the magnetic field may be caused by the magnet. The further change in the magnetic field may be caused by one or more magnets.

In operation 524, in the awake operating mode, the controller may receive a further signal from the magnetic sensor circuit. The further signal from the magnet sensor circuit may indicate that the magnetic field is detected proximate to the magnetic sensor circuit. The magnetic field may be generated by the magnet. The magnetic field may be generated by a new magnet (not shown). The magnetic field may be generated by other objects.

In operation 526, in response to receiving the further signal from the magnetic sensor circuit, the controller may perform an additional function. The additional function may be determined based on the environment or situation of the device. Exemplary embodiments of the additional functions will be further described below.

In operation 528, in response to receiving the further signal from the magnetic sensor circuit, the controller may output a notification to a sensory output device. The sensory output device may include one or more of an audio output device, a light output device, and/or a vibratory output device. In some cases, in response to receiving the further signal from the magnetic sensor circuit, the controller may send a notification to the remote server. The notification may include information regarding the presence, strength and/or direction of the magnetic field. In some cases, in response to receiving the further signal from the magnetic sensor circuit, the controller may log an event in the memory module. The event may include sensor data, such as temperature, pressure, humidity, GPS and/or sound. In some cases, in response to receiving the further signal from the magnetic sensor circuit, the controller may trigger an operation of another component coupled to the device, such as a short-range wireless device, for example, to initiate a pairing procedure. In some cases, in response to receiving the further signal from the magnetic sensor circuit, the controller may capture data from one or more sensors for transmission to the remote server, such as a temperature sensor, a pressure sensor, an accelerometer, a gyroscope, a proximity sensor, a GPS module, etc.

Reference is now again made to FIG. 2 with respect to the following paragraphs. In some embodiments, the controller 210 in the awake operating mode may receive instructions to switch the awake operating mode to a selected operating mode. The selected operating mode may cause the controller to perform a different additional function. The different additional function may rely on the magnetic sensor circuit 214. The executable instructions of the selected operating mode may be stored in the controller or the memory module 216.

In some embodiments, the controller 210 may receive a new operating mode, via the communications module 212, from the remote server 120. Put differently, the controller 210 may download the new operating mode from the remote server 120. The controller 210, in response to receiving the new operating mode, may switch from the awake operating mode to the new operating mode. The new operating mode may cause the controller 210 to perform a further additional function when a signal is received from the magnetic sensor circuit 214.

The following paragraphs illustrate exemplary embodiments of the additional function which may reutilize or repurpose the magnetic sensor circuit 214. The executable instructions of the awake operating mode with respect to the additional function may be stored in the controller 210, stored in the memory module 216, and/or provided by the remote server 120.

In some embodiments, the further signal from the magnetic sensor circuit 214 may indicate that the magnetic field is detected with respect to a door magnet attached to a sliding or barn door (not shown). In other words, the awake operating mode is programmed for door detection. The sliding door may be located on a freight container or a tractor trailer. When the door moves from the closed position to the open position, the magnetic sensor circuit 214 may detect a change in the magnetic field. As a result, the magnetic sensor circuit 214 may send a further signal to the controller 210. In some cases, in response to receiving the further signal, the controller 210 may determine the position of the sliding door based on the further signal. In some cases, in response to receiving the further signal, the controller 210 may send, via the communications module 212, data regarding the position of the sliding door to the remote server 120. In some cases, the magnet 112 may be reused and repurposed as the door magnet and attached to the sliding door for sensing by the magnetic sensor circuit 214.

In some embodiments, the further signal from the magnetic sensor circuit 214 may indicate that the magnetic field is detected with respect to a hopper switch. In other words, the awake operating mode is programmed for hopper switch detection. For example, the hopper switch may emit or generate a magnetic field. The magnetic sensor circuit 214 may detect the presence of a magnetic field. In response to the presence of the magnetic field, the magnetic sensor circuit 214 may send a signal to the controller 210. In response to receiving the further signal, the controller 210 may send, via the communications module 212, data regarding the hopper switch to the remote server 120. For example, the data may include the GPS location of the hopper switch, or an image of the hopper switch.

In some embodiments, the further signal from the magnetic sensor circuit 214 may indicate that the magnetic field is detected with respect to a trailer connector. A new magnet may be attached to the trailer connector. In other words, the awake operating mode is programmed for trailer connecter detection. For example, the trailer connecter coupled to the new magnet may emit or generate a magnetic field. The magnetic sensor circuit 214 may detect a presence of a magnetic field from the trailer connector. In response to the presence of the magnetic field, the magnetic sensor circuit 214 may send a signal to the controller 210. In response to receiving the further signal, the controller 210 may send, via the communications module 212, data regarding the trailer. The data may include the license plate information, type of trailer, size and capacity, ownership, etc.

In some embodiments, the magnetic sensor circuit 214 may be deactivated as it could lead to a security breach of the device 110. The further signal from the magnetic sensor circuit 214 may indicate that the magnetic field detected is an unknown magnetic field. In other words, the awake operating mode is programmed for threat detection. For example, the magnetic sensor circuit 214 may detect an unknown magnetic field. The magnetic sensor circuit 214 may send a signal to the controller 210. The signal may be an alert or warning signal. In response to the signal, the controller 210 may send, via the communications module 212, a message to the remote server 120 that the device 110 may have been tampered with or a warning message.

In some embodiments, in the awake operating mode, the further signal from the magnetic sensor circuit 214 may trigger the controller 210 to request an update from the remote server 120.

In some embodiments, the additional function may include initiating pairing between the device 110, via the communications module 212, and an asset device (not shown). The asset device may include an asset tracking device, a sensor device, and a cellular device. The pairing between the device 110 and the asset device may be through Bluetooth, Bluetooth low energy (BLE), and/or Wi-fi.

In some embodiments, the device 110 may include a plurality of magnetic field sensors coupled to the magnetic sensor circuit 214. A plurality of signals from the magnetic sensor circuit 214 may be caused by the change in the magnetic field from the plurality of magnetic field sensors. The plurality of magnetic sensors of the magnetic sensor circuit 214 may be coupled to one or more magnets. The one or more signals from the magnetic sensor circuit 214 may be provided to the controller 210. In response to receiving the one or more signals from the magnetic sensor circuit 214, the controller 210 may send, via the communications module 212, to the remote server 120 an orientation of the device 110 based on the one or more signals from the magnetic sensor circuit 214.

The above discussed embodiments are considered to be illustrative and not restrictive. Certain adaptations and modifications of the described embodiments may be made. All such modification, permutations and combinations are intended to fall within the scope of the present disclosure.

What is claimed is:

1. A reusable system for magnetic sensing comprising:

a housing enclosure;

a magnetic sensor circuit disposed within the housing enclosure for detecting a magnetic field;

a magnet initially located at a first location outside of the housing enclosure and removably coupled to the housing enclosure, the magnet at the first location being in close proximity to the magnetic sensor circuit;

a wireless transceiver;

a controller, coupled to the magnetic sensor circuit and to the wireless transceiver, and having a sleep operating mode and an awake operating mode, wherein the sleep operating mode is a low-power mode in which wireless transmissions are disabled or reduced, and wherein the awake operating mode is a mode in which the controller enables wireless transmissions and monitors the magnetic sensor circuit, storing executable instructions which, when executed, cause the controller to:

receive, from the magnetic sensor circuit, a first signal indicating a lack of presence of the magnetic field, the first signal generated in response to removal of the magnet from the housing enclosure without opening the housing enclosure, wherein the first signal is received when the controller is in the sleep operating mode;

in response to the first signal, switch from the sleep operating mode to the awake operating mode, send a second signal, via the wireless transceiver, to a remote server indicating a transition of the reusable system from the sleep operating mode to the awake operating mode, wherein, in the awake operating mode, the controller listens for a third signal, the third signal indicating detection of the magnetic field after the magnet is moved into proximity of the magnetic sensor circuit wherein, after removal from the housing enclosure, the magnet is positioned at a second location different from the first location and reused to cause the third signal;

receive the third signal, the third signal received after the first signal is received; and in response to the third signal, the controller performs a function including one or more of transmitting to the remote server a message regarding detection of the magnetic field, outputting a sensory signal, initiating pairing, or requesting and applying an update, wherein the remote server is remote from the reusable system and accessible via a wireless network.

2. The reusable system of claim 1, wherein the instructions, when executed, further cause the controller to receive, after receiving the third signal, a fourth signal from the magnetic sensor circuit indicating that the magnetic field is not detected proximate the magnetic sensor circuit.

3. The reusable system of claim 2, wherein the function includes causing transmission of a message to the remote server regarding a lack of detection of the magnetic field.

4. The reusable system of claim 1, wherein the reusable system includes at least one sensory output device and wherein the function includes causing output of a sensory signal from the sensory output device.

5. The reusable system of claim 4, wherein the sensory output device includes one or more of an audio output device, a light output device, or a vibratory output device.

6. The reusable system of claim 1, wherein the instructions, when executed, further cause the controller to:

receive a fourth signal, via the wireless transceiver from the remote server, to switch the awake operating mode to a selected operating mode, wherein the selected operating mode includes at least one or more of a pair mode, a door detection mode, a hopper switch detection mode, or a trailer connector detection mode; and in response to the fourth signal, the controller performs another function including at least one of transmit a further message to the remote server, output the sensory signal, initiate the pairing, request and apply configuration updates.

7. The reusable system of claim 1, wherein the instructions, when executed, further cause the controller to:

receive a new operating mode, via the wireless transceiver from the remote server, wherein the new operating mode includes a configuration received from the remote server comprising at least one operating parameter or a mode identifier; and in response to receiving the new operating mode, switch the controller to the new operating mode and perform another function including at least one of transmit a further message to the remote server, output the sensory signal, initiate the pairing, request and apply configuration updates.

8. The reusable system of claim 1, wherein the third signal from the magnetic sensor circuit indicates that the magnetic field is detected with respect to the magnet coupled as a door magnet coupled to a sliding door at the second location, and the function includes causing transmission of a message, via the wireless transceiver, to the remote server regarding a position of the sliding door.

9. The reusable system of claim 1, wherein the third signal from the magnetic sensor circuit indicates that the magnetic field is detected with respect to a hopper switch, and the function includes causing transmission of a message, via the wireless transceiver, to the remote server regarding data of the hopper switch.

10. The reusable system of claim 1, wherein the third signal from the magnetic sensor circuit indicates that the magnetic field is detected with respect to a trailer connector, and the function includes initiating pairing between the reusable system and an asset device, wherein the asset is one or more of an asset tracking device attached to a container, a trailer, or a vehicle frame or a device configured to track a container, a trailer, or a vehicle frame.

11. The reusable system of claim 1, wherein the third signal from the magnetic sensor circuit indicates an unknown magnetic field, and the function includes causing transmission of a message, via the wireless transceiver, to the remote server regarding a threat.

12. The reusable system of claim 1, wherein the function includes causing transmission of a message, via the wireless transceiver, to the remote server requesting an update, receive the update from the remote server, and in response to receiving the update, perform another function including at least one of transmit a further message to the remote server, output the sensory signal, initiate the pairing, request and apply configuration updates.

13. The reusable system of claim 1, wherein the function includes initiating pairing between the reusable system and an asset device, wherein the asset is one or more of an asset tracking device attached to a container, a trailer, a vehicle frame or a device configured to track a container, a trailer, a vehicle frame.

14. The reusable system of claim 1, wherein the reusable system includes a plurality of magnetic field sensors coupled to the magnetic sensor circuit, and wherein the function includes the following:

receiving a plurality of magnetic fields from the plurality of magnetic field sensors;

determining an orientation of the reusable system based on the plurality of magnetic fields; and in response to the determination of the orientation, send a fourth signal, via the wireless transceiver, to the remote server, indicating the orientation of the reusable system.

15. A computer-implemented method for switching operating modes of a device based on a first signal from a magnetic sensor circuit, the method comprising:

providing the device including a housing enclosure, a controller coupled to a wireless transceiver and to the magnetic sensor circuit disposed within the housing enclosure, and a magnet initially located at a first location outside of the housing enclosure and removably coupled to the housing enclosure, the magnet at the first location being in close proximity to the magnetic sensor circuit, receiving the first signal from the magnetic sensor circuit indicating a lack of presence of a magnetic field, the first signal generated in response to removal of the magnet from the housing enclosure without opening the housing enclosure, wherein the first signal is received when the controller is in a sleep operating mode;

in response to the first signal, switching from the sleep operating mode to an awake operating mode, sending a second signal, via the wireless transceiver, to a remote server indicating a transition of the device from the sleep operating mode to an awake operating mode, wherein, in the awake operating mode, the controller listens for a third signal, the third signal indicating detection of the magnetic field after the magnet is moved into proximity of the magnetic sensor circuit, wherein, after removal from the housing enclosure, the magnet is positioned at a second location different from the first location and reused to cause the third signal, wherein the sleep operating mode is a low-power mode in which wireless transmissions are disabled or reduced, and wherein the awake operating mode is a mode in which the controller enables wireless transmissions and monitors the magnetic sensor circuit;

receiving the third signal, the third signal received after the first signal is received; and in response to the third signal, the controller performs a function including one or more of transmitting to the remote server a message regarding detection of the magnetic field, outputting a sensory signal, initiating pairing, or requesting and applying an update, wherein the remote server is remote from the device and accessible via a wireless network.

16. The method of claim 15, further comprising receiving, after receiving the third signal, a fourth signal from the magnetic sensor circuit indicating the magnetic field is not detected proximate the magnetic sensor circuit.

17. The method of claim 16, further comprising, in response to the fourth signal, causing transmission of a message to the device regarding a lack of detection of the magnetic field.

18. The method of claim 15, wherein the device includes at least one sensory output device and wherein the function includes causing output of a sensory signal from the sensory output device.

19. The method of claim 18, wherein the at least one sensory output devices includes one or more of an audio output device, a light output device, or a vibratory output device.

20. The method of claim 15, wherein the third signal from the magnetic sensor circuit indicates that the magnetic field is detected with respect to the magnet coupled as a door magnet coupled to a sliding door at the second location, and the function includes causing transmission of a message, via the wireless transceiver, to the remote server regarding a position of the sliding door.

* * * * *